(12) United States Patent
Gubser et al.

(10) Patent No.: US 9,445,536 B1
(45) Date of Patent: Sep. 13, 2016

(54) CRYSTAL OSCILLATOR FABRICATION METHODS USING DUAL-DEPOSITION OF MOUNTING CEMENT AND DUAL-CURING TECHNIQUES

(71) Applicant: Integrated Device Technology, Inc., San Jose, CA (US)

(72) Inventors: Robert A. Gubser, Arlington, WA (US); Ajay Kumar Ghai, San Jose, CA (US); Viresh Piyush Patel, Austin, TX (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 86 days.

(21) Appl. No.: 14/586,534

(22) Filed: Dec. 30, 2014

(51) Int. Cl.
*H05K 13/04* (2006.01)
*H03B 1/00* (2006.01)

(52) U.S. Cl.
CPC ............ *H05K 13/0469* (2013.01); *H03B 1/00* (2013.01)

(58) Field of Classification Search
CPC .............................. H05K 13/0469; H03B 1/00
USPC .......................................................... 165/280
See application file for complete search history.

(56) References Cited

U.S. PATENT DOCUMENTS

| | | |
|---|---|---|
| 5,577,319 A | 11/1996 | Knecht |
| 5,702,775 A | 12/1997 | Anderson et al. |
| 5,815,054 A | 9/1998 | Vojak et al. |
| 5,928,598 A | 7/1999 | Anderson et al. |
| 6,114,937 A | 9/2000 | Burghartz et al. |
| 6,635,949 B2 | 10/2003 | Lowther et al. |
| 6,759,727 B2 | 7/2004 | Ju |
| 6,786,654 B2 | 9/2004 | Kilian |
| 6,798,039 B1 | 9/2004 | Gillespie et al. |
| 6,998,925 B2 | 2/2006 | Harima et al. |
| 7,034,441 B2 | 4/2006 | Ono et al. |
| 7,291,513 B2 | 11/2007 | Ouellet et al. |
| 7,605,521 B2 | 10/2009 | Kuwahara |
| 7,872,537 B2 | 1/2011 | Tanaka |
| 7,955,885 B1 | 6/2011 | Bhugra et al. |
| 8,035,454 B2 | 10/2011 | Navet |
| 8,164,159 B1 | 4/2012 | Armstrong et al. |
| 8,294,260 B2 | 10/2012 | Ito et al. |
| 8,476,810 B2 | 7/2013 | Hashi |

(Continued)

OTHER PUBLICATIONS

Zoschke et al. "Hermetic Wafer Level Packaging of MEMS Components Using Through Silicon Via and Wafer to Wafer Bonding Technologies", *The 63$^{rd}$ Electronic Components and Technology Conference, ECTC 2013*, May 28-31, 2013, Las Vegas, NV, USA, 33 pages.

(Continued)

*Primary Examiner* — Daniel Lee
(74) *Attorney, Agent, or Firm* — Myers Bigel & Sibley P.A.

(57) ABSTRACT

A crystal oscillator fabrication method includes depositing mounting cement onto first and second mounting pads on a substrate to thereby define first and second electrode adhesion bumps. First and second electrodes of a crystal oscillator are electrically connected to the first and second mounting pads by contacting the first and second electrodes to the first and second electrode adhesion bumps and then curing the adhesion bumps. Next, mounting cement is deposited onto the first electrode and onto a portion of the first electrode adhesion bump to thereby define a top electrode adhesion extension. The top electrode adhesion extension is then cured.

14 Claims, 20 Drawing Sheets

(56) References Cited

U.S. PATENT DOCUMENTS

| | | |
|---|---|---|
| 8,482,358 B2 | 7/2013 | Yamada |
| 2005/0258507 A1 | 11/2005 | Tseng et al. |
| 2006/0016065 A1 | 1/2006 | Nagaura |
| 2007/0085648 A1 | 4/2007 | Lee et al. |
| 2008/0042260 A1 | 2/2008 | Jeong et al. |
| 2008/0231145 A1* | 9/2008 | Nagano ............... B22F 1/0074 310/344 |
| 2009/0015363 A1 | 1/2009 | Gardner |
| 2012/0025673 A1 | 2/2012 | Nagano et al. |
| 2012/0056510 A9 | 3/2012 | Chen et al. |
| 2013/0335157 A1 | 12/2013 | Ishii et al. |

OTHER PUBLICATIONS

Zoschke et al. "Hermatic Wafer Level Packaging of MEMS Components Using Through Silicon Via and Wafer to Wafer Bonding Technologies", *IEEE 2013 Electronic Components & Technology Conference*, 2013, 1500-1507.

Ruffieux et al., "A Versatile Timing Microsystem Based on Wafer-Level Packaged XTAL/BAW Resonators with Sub-uW RTC Mode and Programmable HF Clocks", 2013 IEEE International Solid-State Circuits Conference, Feb. 19, 2013, pp. 196-198.

* cited by examiner

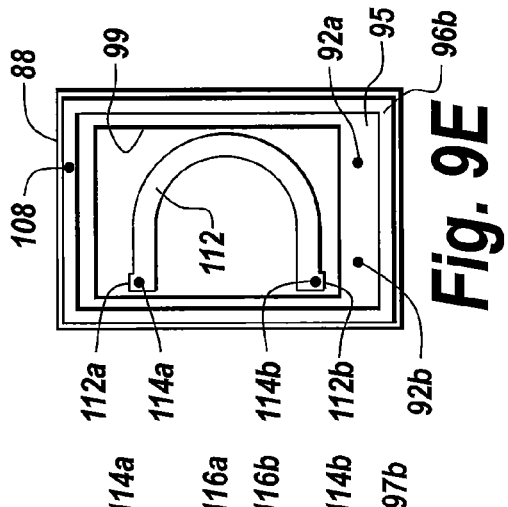
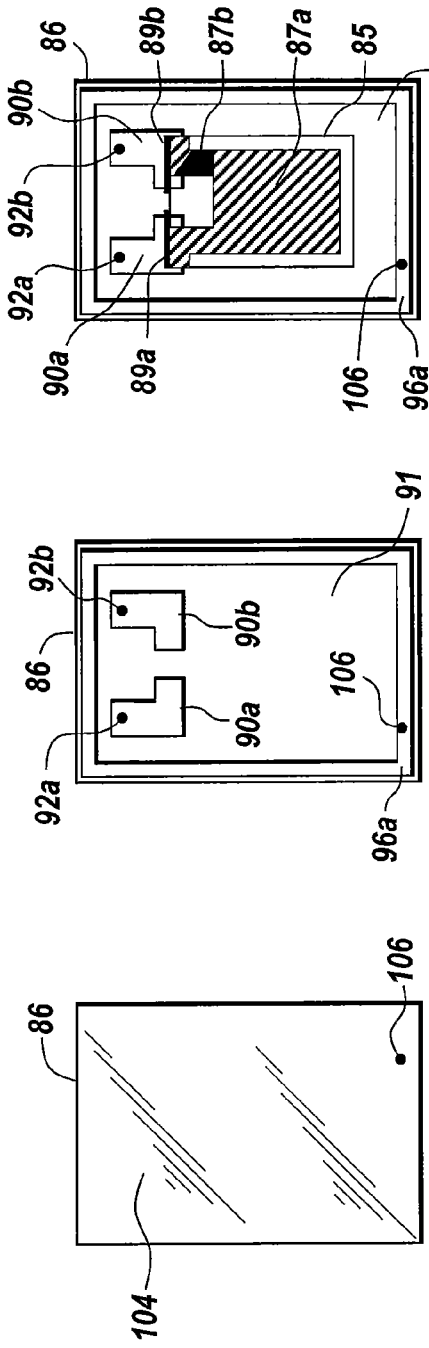
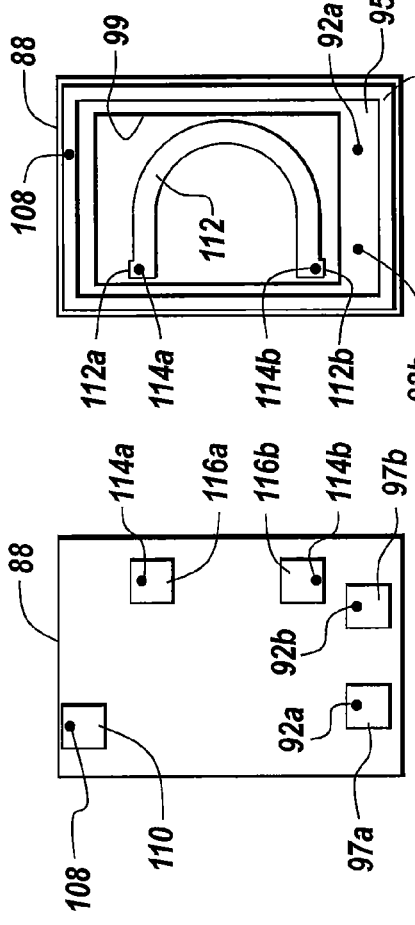

US 9,445,536 B1

CRYSTAL OSCILLATOR FABRICATION METHODS USING DUAL-DEPOSITION OF MOUNTING CEMENT AND DUAL-CURING TECHNIQUES

CROSS-REFERENCE TO RELATED APPLICATIONS

This application is related to: U.S. application Ser. No. 14/015,471, filed Aug. 30, 2013; U.S. application Ser. No. 14/136,040, filed Dec. 20, 2013; U.S. application Ser. No. 14/586,508, filed Dec. 30, 2014, entitled "Integrated Circuit Device Substrates Having Packaged Crystal Resonators Thereon,"; and U.S. application Ser. No. 14/586,525, filed Dec. 30, 2014, entitled "Integrated Circuit Device Substrates Having Packaged Inductors Thereon," the disclosures of which are hereby incorporated herein by reference.

FIELD OF THE INVENTION

The present invention relates to integrated circuit devices and methods of forming same and, more particularly, to oscillator circuits and methods of forming same on integrated circuit substrates.

BACKGROUND OF THE INVENTION

Current state-of-the art microelectromechanical (MEMs) resonators have recently challenged the quartz-dominated timing industry, notwithstanding the perceived temperature instabilities of such MEMs devices, which has led to the development of very high performance temperature sensors in MEMs-based circuits to thereby support levels of frequency stability that are typically associated with crystal oscillators (XO). Moreover, because one of the significant advantages of MEMs-based technology is the highly integrated semiconductor manufacturing technologies that support high volume wafer-level encapsulation of MEMs components, efforts have been made to determine how crystal-based resonators can benefit from similar wafer-level scale and vacuum sealing packaging technologies. One example of a wafer-scale packaging technology is disclosed in U.S. Pat. No. 7,955,885 to Bhugra et al., entitled "Methods of Forming Packaged Micro-Electromechanical Devices," the disclosure of which is hereby incorporated herein by reference.

An example of a conventional real time clock (RTC) module includes a hybrid combination of an application specific integrated circuit (ASIC) and a crystal blank inside a ceramic package. However, as disclosed in an article by Ruffieux et al., entitled "A Versatile Timing Microsystem Based on Wafer-Level Packaged XTAL/BAW Resonators with Sub-uW RTC Mode and Programmable HF Clocks," 2013 IEEE International Solid-State Circuits Conference, Feb. 19, 2013, pp. 196-198, a ceramic package may be replaced with silicon and the circuit may be implemented as an active part of the package. U.S. Pat. No. 8,035,454 to Navet discloses a crystal oscillator device containing a piezoelectric resonator element and integrated circuit (IC) chip within a vacuum chamber.

Quartz, MEMs and LC-based timing applications typically utilize inductors to support resonance frequencies and/or timing circuit operation (e.g., VCO operation). However, achieving high-quality (i.e., high-Q) inductors can often be difficult using conventional wafer-scale fabrication techniques. As will be understood by those skilled in the art, high-Q inductors require low series resistance, smooth metal surfaces and small grain structure. Typical inductor materials include copper and silver, but not aluminum. Moreover, because inductors create surrounding fields, forming inductors adjacent lossy materials will significantly reduce their Q. Accordingly, high value inductors, such as spiral inductors, may provided insufficiently high Q when formed on an integrated circuit (IC) substrate having relatively low resistivity. One example of a spiral inductor is disclosed in commonly assigned U.S. Pat. No. 6,798,039 to Gillespie et al., entitled "Integrated Circuit Inductors Having High Quality Factors," the disclosure of which is hereby incorporated herein by reference. Another example of an inductor that utilizes encapsulating shielding layers to inhibit a loss in Q is disclosed in commonly assigned U.S. Pat. No. 8,164,159 to Armstrong et al., entitled "Semiconductor Resonators with Electromagnetic and Environmental Shielding and Methods of Forming Same," the disclosure of which is hereby incorporated herein by reference.

SUMMARY OF THE INVENTION

A crystal oscillator fabrication method according to some embodiments of the invention includes attaching a crystal oscillator to an underlying substrate (e.g., semiconductor substrate) by depositing electrically conductive mounting cement onto first and second electrically conductive mounting pads to thereby define first and second electrode adhesion bumps thereon. First and second electrodes of the crystal oscillator are electrically connected to the first and second mounting pads, respectively, by contacting the first and second electrodes to the first and second electrode adhesion bumps, respectively. The first and second electrode adhesion bumps are then cured. Following this initial curing, additional electrically conductive mounting cement is deposited onto the first electrode and onto a portion of the first electrode adhesion bump to thereby define a top electrode adhesion extension. The top electrode adhesion extension is then cured. According to some of these embodiments of the invention, the first electrode extends primarily on a top surface of the crystal and partially on a bottom surface of a crystal and the second electrode extends primarily on the bottom surface of the crystal and partially on the top surface of the crystal.

According to additional embodiments of the invention, the step of depositing electrically conductive mounting cement can include depositing electrically conductive mounting cement onto the second electrode and onto a portion of the second electrode adhesion bump to thereby define a bottom electrode adhesion extension on the top surface of the crystal. In addition, the step of curing the top electrode adhesion extension may include simultaneously curing the bottom electrode adhesion extension. According to further embodiments of the invention, the sides of the crystal are not contoured or beveled, but, rather, have flat surfaces that meet the top and bottom surfaces of the crystal at right angles.

Based on these methods, the top electrode adhesion extension and the first electrode adhesion bump operate in combination to mechanically secure and electrically short the top electrode to the first mounting pad. In addition, the bottom electrode adhesion extension (on the top surface of the crystal) and the second electrode adhesion bump operate in combination to mechanically secure and electrically short the bottom electrode to the second mounting pad.

According to still further embodiments of the invention, the first mounting pad is a dumbbell-shaped mounting pad with a constricted neck region intermediate first and second opposing ends thereof. Based on this configuration, the first electrode adhesion bump may be formed to extend directly on the first end of the dumbbell-shaped mounting pad and the top electrode adhesion extension may be formed to extend directly on the second end of the dumbbell-shaped mounting pad.

Additional embodiments of the invention include an integrated circuit substrate having an at least two piece package thereon, which includes a hermetically sealed cavity therein and a crystal resonator within the cavity. The crystal resonator includes at least one electrode electrically coupled to a portion of the underlying integrated circuit substrate by an electrically conductive via, which extends at least partially through the package. In some embodiments of the invention, the package includes a material selected from a group consisting of glass and ceramics. In other embodiments, the hermetically sealed cavity is devoid of any semiconductor-based electrical devices therein. In still other embodiments, the integrated circuit substrate may include a semiconductor chip, which is sealed within a larger package that contains the at least two piece package therein.

According to further embodiments of the invention, the crystal resonator includes a crystal and first and second electrodes on first and second opposing sides of the crystal. The package is also configured to include a base having a recess therein and a cap hermetically sealed to the base. This cap may also have first and second electrical traces thereon, which are electrically connected to the first and second electrodes of the crystal resonator, respectively. In addition, the base includes first and second electrically conductive vias therein, which are electrically connected to the first and second electrical traces, respectively, by a pair of electrically conductive solder connectors. These solder connectors may be located in the cavity and the first and second electrical traces may be patterned on an interior bottom surface of the cap, within the cavity. A perimeter of the cavity may also be defined by a pair of opposing top and bottom electrically conductive seal rings on a bottom surface of the cap and an upper surface of the base, respectively. These seal rings may be sealed together by a solder seal ring (e.g., frame-shaped ring).

According to still further embodiments of the invention, an electrically conductive ground shield is provided on a top surface of the cap and an electrically conductive shield via is provided, which extends through the cap and electrically connects the ground shield to the frame-shaped solder seal ring. In addition, the base may include an electrically conductive ground via therein, which electrically connects the frame-shaped solder seal ring to an electrical trace on the integrated circuit substrate.

According to additional embodiments of the invention, a bottom surface of the package is solder bonded to the integrated circuit substrate by at least a pair of solder bonds, which are electrically connected to an integrated circuit within the integrated circuit substrate and the first and second electrically conductive vias in the base of the package. In particular, the integrated circuit substrate may include a semiconductor chip having active electrical components of an oscillator circuit therein. At least one of these active electrical components may be electrically coupled to the at least one electrode of the crystal resonator by an electrically conductive via within the package.

According to further embodiments of the invention, an integrated circuit device is provided with an integrated circuit substrate having a two piece package thereon. The package has a sealed cavity therein and a crystal resonator and inductor are provided within the cavity. The crystal resonator includes a first electrode, which is electrically coupled to a first contact pad on the integrated circuit substrate. This electrical coupling is provided by a first electrically conductive via, which extends at least partially through the package. In addition, the inductor may have a first terminal, which is electrically coupled to a second contact pad on the integrated circuit substrate by a second electrically conductive via, which extends at least partially through the package.

According to further embodiments of the invention, the crystal resonator includes a crystal and first and second electrodes on first and second opposing sides of the crystal. The package also includes a base having a recess therein and a cap hermetically sealed to the base. In addition, the crystal resonator and the inductor may be disposed on the cap and base, respectively, or vice versa. A perimeter of the cavity may also be defined by a pair of opposing top and bottom electrically conductive seal rings on a bottom surface of the cap and an upper surface of the base, respectively. These top and bottom electrically conductive seal rings may be sealed together by a solder seal ring. An electrically conductive ground shield may be provided on a top surface of the cap and an electrically conductive shield via may extend through the cap. This shield via electrically connects the ground shield to the frame-shaped solder seal ring. An electrically conductive ground via may also be provided in the base, which electrically connects the frame-shaped solder seal ring to an electrical trace and/or contact pad on the integrated circuit substrate.

According to additional embodiments of the invention, an integrated circuit device is provided with an integrated circuit substrate having an at least two piece package thereon, with each piece formed of glass or a ceramic material. The package includes a sealed cavity therein and a patterned metal inductor in the cavity. The inductor includes at least a first terminal electrically coupled to a portion of the integrated circuit substrate by an electrically conductive via, which extends at least partially through the package. The package includes a base and a cap sealed to the base, and the metal inductor includes a metal layer patterned on at least one of the cap and base of the package. Thus, the package may include a single inductor which is patterned on the cap and/or base, or a pair of inductors on the cap and base, or even a pair of inductors having sufficient mutual coupling therebetween to operate as a transformer located within the cavity.

According to further aspects of these embodiments of the invention, the base includes at least first and second electrically conductive vias extending therethrough, which are electrically connected to first and second terminals of the inductor, respectively. In addition, the cavity may be defined by a pair of opposing top and bottom electrically conductive seal rings on a bottom surface of the cap and an upper surface of the base, respectively. These top and bottom electrically conductive seal rings may be sealed together by a frame-shaped solder seal ring. An electrically conductive ground shield may also be provided on a top surface of the cap and an electrically conductive shield via extending through the cap, which electrically connects the ground shield to the frame-shaped solder seal ring. The base may also include an electrically conductive ground via therein, which electrically connects the frame-shaped solder seal ring to an electrically conductive contact pad and/or metal trace on the integrated circuit substrate. This electrical connection to the contact pad may be provided by a solder bond between the contact pad and the ground via.

According to additional aspects of these embodiments of the invention, the cavity, which may be hermetically or polymer sealed, may be devoid of any semiconductor-based electrical devices therein. A bottom surface of the package may also be solder bonded to the integrated circuit substrate by at least a pair of solder bonds, which are electrically connected to respective portions of an integrated circuit within the integrated circuit substrate and the first and second electrically conductive vias in the base. An electrically conductive floating magnetic shield may also be provided on a top surface of the cap. Likewise, an electrically conductive ground shield may be provided on a bottom surface of the cap and be electrically connected to the frame-shaped solder seal ring.

According to additional embodiments of the invention, the cap of the package may have a recess therein that faces the inductor, which extends on an upper surface of the base. An electrically conductive magnetic shield may also be provided, which covers at least a portion of the inner recess in the cap. This magnetic shield may be electrically connected to the frame-shaped solder seal ring. Moreover, the base may include an electrically conductive ground via therein that electrically connects the frame-shaped solder seal ring to an electrically conductive contact pad on the integrated circuit substrate.

BRIEF DESCRIPTION OF THE DRAWINGS

FIG. 9A is a top-down plan view of the packaged crystal resonator and inductor of FIG. 8A, according to an embodiment of the invention.

FIG. 9B is a bottom-up plan view of a package cap of FIG. 8A, according to an embodiment of the invention.

FIG. 9C is a bottom-up plan view of the package cap of FIG. 9B after mounting of a crystal resonator thereto, according to an embodiment of the invention.

FIG. 9D is a bottom-up plan view of a package base of FIG. 8A, according to an embodiment of the invention.

FIG. 9E is a top-down plan view of the package base of FIG. 8A, with a horseshoe-shaped inductor within a recess, according to an embodiment of the invention.

DETAILED DESCRIPTION OF EMBODIMENTS

Figure 1A:
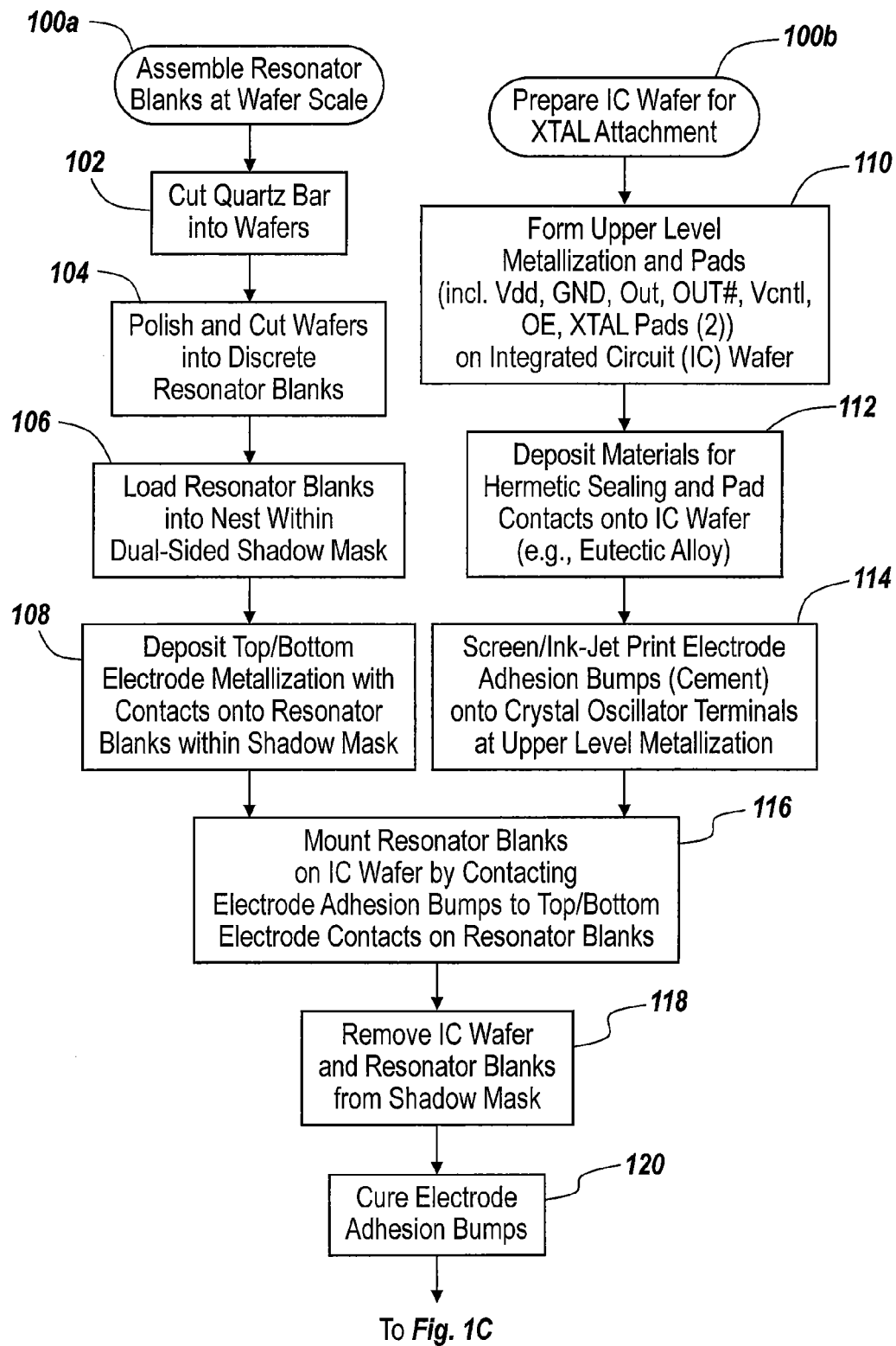
FIGS. 1A-1C are flow diagrams that illustrate methods of forming crystal-based oscillator circuits using wafer-scale fabrication techniques, according to embodiments of the invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
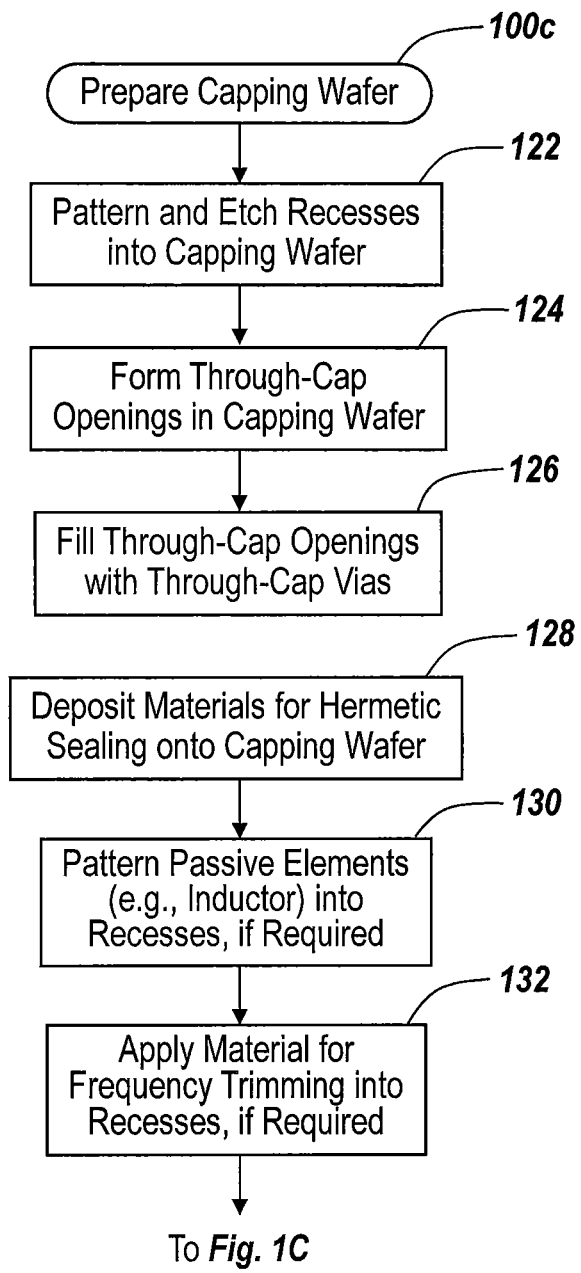
Figure 1C:
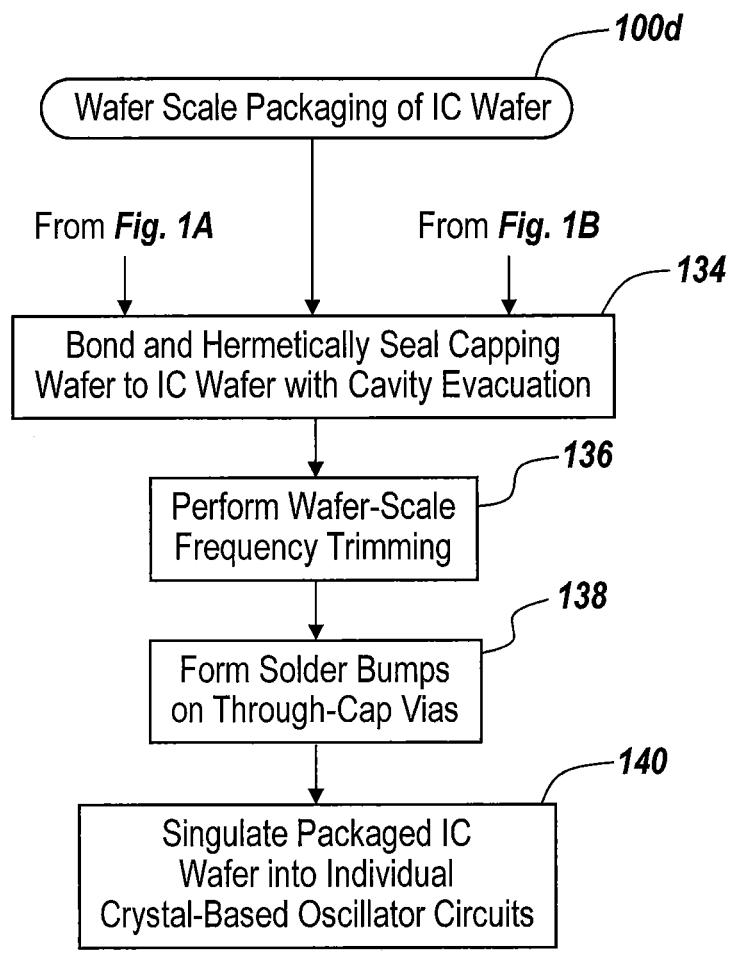

Referring now to FIGS. 1A-1C, methods of forming crystal-based oscillator circuits using wafer-scale fabrication techniques include: assembling resonator blanks at wafer scale 100a; preparing an integrated circuit (IC) wafer for crystal (XTAL) attachment 100b; preparing a capping wafer 100c; and performing wafer scale packaging of the IC wafer 100d. With respect to FIG. 1A, operations to assemble resonator blanks at wafer scale 100a may include cutting a bar of quartz into a plurality of wafers, Block 102, which are then polished and cut into discrete resonator blanks (e.g., rectangular resonator blanks), Block 104. The resonator blanks may be loaded into a quartz blank holder having a two-dimensional array of openings therein that span the active area of a semiconductor wafer. According to some embodiments of the invention, the quartz blank holder may include a nest, which is sandwiched between a pair of top and bottom shadow masks, Block 106. These shadow masks are utilized to define top and bottom electrodes on the resonator blanks. Thereafter, as shown by Block 108, top and bottom electrode metallization (with contact metallization) is deposited onto the resonator blanks within the shadow masks, Block 108. Although not shown, additional masks may also be used to enable the deposition of electrically conductive cement onto the contact metallization to thereby support attachment of the resonator blanks to an underlying integrated circuit wafer.

As shown by the right-side of FIG. 1A, operations to prepare an integrated circuit (IC) for crystal attachment 100b may include forming upper level metallization and external contact pads on a passivation layer, which covers an integrated circuit wafer having crystal-oscillator circuitry embedded therein, Block 110. According to some embodiments of the invention, the external contact pads may include a plurality of pads (e.g., six pads): a power supply contact pad (Vdd), a reference voltage contact pad (GND), a pair of differential periodic output signal pads OUT, OUT#, an input control voltage pad (Vcntl) and an output enable/disable pad (OE). Materials for hermetic sealing the IC wafer to a capping wafer may be selectively deposited onto the passivation layer, Block 112. The hermetic sealing material may be a eutectic alloy, which can also be deposited onto the external contact pads to enable electrical contact to corresponding through-substrate vias (within a capping wafer), as explained more fully hereinbelow. However, in alternative embodiments of the invention, a sealing material may be used that does not provide a fully hermetic seal. For example, the deposited sealing material may be suitable for glass frit bonding (a/k/a glass soldering, seal glass bonding), which utilizes a low melting temperature glass.

The step of forming the upper level metallization on the passivation layer, Block 110, may also include forming crystal oscillator terminals (in pairs) thereon. Thereafter, as illustrated by Block 114, electrode adhesion bumps (e.g., electrically conductive cement) may be deposited on the crystal oscillator terminals using, for example, screen or ink-jet printing. Other deposition techniques may also be used.

Referring still to FIG. 1A, the nested crystal resonator blanks may be mounted onto the integrated circuit wafer by contacting the electrode adhesion bumps to the top/bottom electrode contacts on the crystal resonator blanks, Block 116. As described above, the electrode adhesion bumps may be contacted directly to any electrically conductive cement on the top/bottom electrode contacts. This use of electrically conductive cement on the top/bottom electrode contacts of the resonator blanks may be particularly advantageous for overtone-mode resonator blanks (e.g., $3^{rd}$, $5^{th}$ overtone blanks) having sharp edges. As shown by Blocks 118, 120, the integrated circuit wafer (with resonator blanks mounted thereon) is removed from the shadow mask and the electrode adhesion bumps (e.g., conductive cement) are cured. In some embodiments of the invention, the curing of the adhesion bumps may be performed as a two-step cure process performed in a vacuum. In these embodiments, the first step is performed at a sufficiently high temperature to drive off volatiles in the cement and then the second step is performed at a higher temperature to increase the strength of the cement in supporting the resonator blanks. In still further embodiments of the invention, the contacting of the electrode adhesion bumps to the top/bottom electrode contacts, Block 116, may be performed using a pre-heated conductive cement.

As shown by FIG. 1B, operations to prepare a capping wafer 100c can include patterning and selectively etching deep recesses into a capping wafer, Block 122, using, for example, deep reactive ion etching (DRIE). These recesses may be rectangular in shape and of sufficient size to fully enclose subsequently received crystal resonator blanks, which are aligned 1:1 thereto when bonded to the integrated circuit wafer. As shown by Blocks 124-126, an array of through-cap openings, which may be formed to extend through the capping wafer, may be filled with through-cap electrically conductive vias/plugs. As described more fully hereinbelow, six openings may be formed around of each of the recesses in the capping wafer and filled to thereby enable electrical contact to the power supply contact pad (Vdd), the reference voltage contact pad (GND), the pair of differential periodic output signal pads OUT, OUT#, the input control voltage pad (Vcntl) and the output enable/disable pad (OE). Alternatively, four pads may be provided for signals OUT, OE, Vdd and GND, when only a single-sided output signal is required. As will be understood by those skilled in the art, the steps illustrated by Blocks 124-126 may actually be performed after the capping wafer and integrated circuit wafer have been bonded together.

Materials for hermetic sealing (e.g., eutectic metal) or non-hermetic sealing may be selectively deposited onto the capping wafer to support bonding operations, as explained hereinbelow, Block 128. If necessary, passive resonator elements (e.g., inductor elements) may be formed within the recesses in the capping wafer, Block 130, in addition to any material (e.g., electrically insulating material) used for frequency trimming (e.g., mass loading), Block 132.

Referring now to FIG. 1C, operations to perform wafer scale packaging of the integrated circuit wafer 100*d* may include bonding and sealing (e.g., hermetic or non-hermetic) the capping wafer to the integrated circuit wafer concurrently with performing vacuum evacuation of the cavities within the recesses in the capping wafer, Block 134. Thereafter, as shown by Block 136, wafer-scale frequency trimming operations may be performed on a device-by-device basis by removing electrode material from one or more of the quartz resonator blanks within the sealed recesses within the capping wafer or depositing material (e.g., insulating material or thinly deposited metal (e.g., Au)) onto the resonator blanks to support frequency adjustment through mass loading. Finally, as shown by Blocks 138 and 140, solder bumps (optional) may be formed on the electrically conductive through-cap vias in the capping wafer before the packaged crystal-based oscillator circuits are singulated into individual circuits by dicing the capping wafer (and underlying integrated circuit wafer) along a two-dimensional grid of dicing streets extending between the hermetically-sealed recesses within the capping wafer.

Figure 2A:
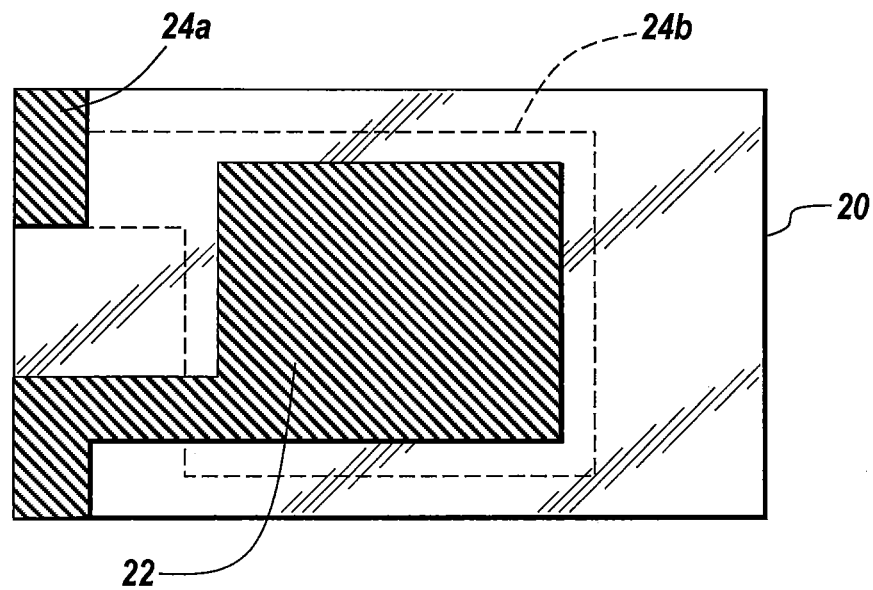
FIGS. 2A-2C are plan views of rectangular-shaped quartz resonator blanks having top and bottom electrodes formed thereon with top-side electrode contacts.
Figure 2B:
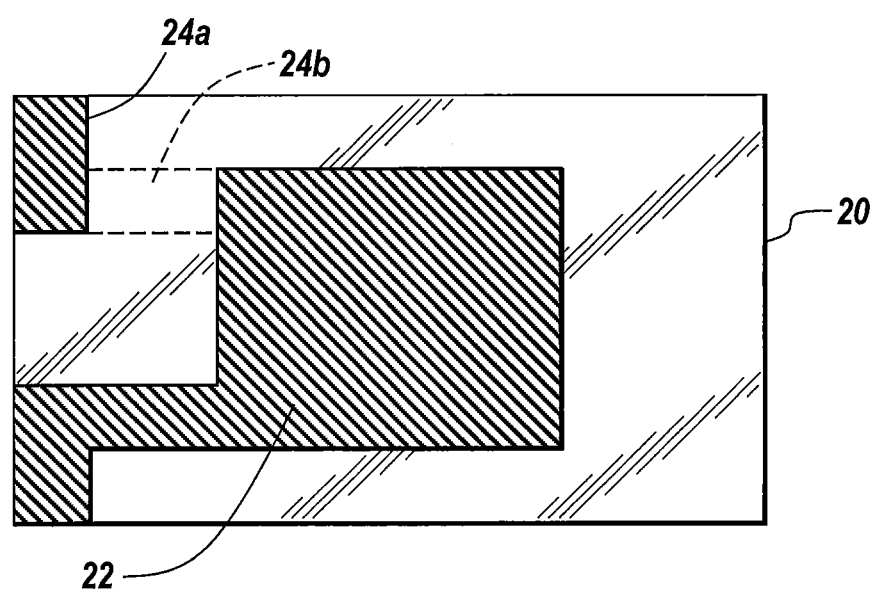
Figure 2C:
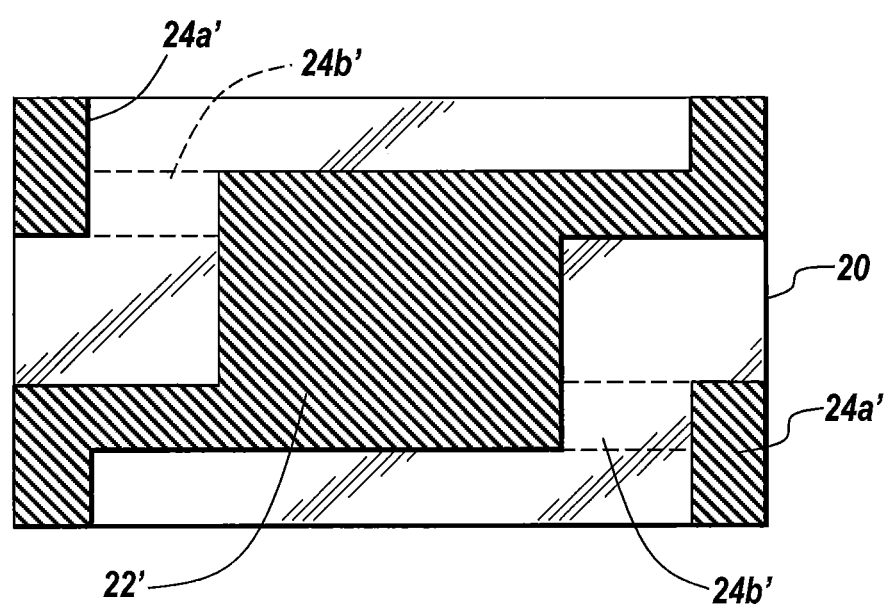

As described above with respect to Blocks 106-108 and 116, the resonator blanks with top/bottom electrode metallization may be configured as illustrated by FIGS. 2A-2C. In particular, as shown by FIG. 2A, a quartz resonator blank 20 may include a top electrode and contact 22 thereon, which is smaller in length and width dimensions relative to a bottom electrode 24*b* (with top-side bottom electrode contact 24*a*). In contrast, FIG. 2B illustrates a quartz resonator blank 20 having a top electrode and contact 22 thereon, which is equivalent in dimensions relative to a bottom electrode 24*b* (with top-side bottom electrode contact 24*a*). FIG. 2C illustrates a quartz resonator blank 20 having a top electrode 22' with diagonally opposite contacts and a bottom electrode 24*b'* with diagonally opposite top-side contacts 24*a'*, which enable multiple orientations (e.g., 180° rotations) of the blank 20 within a quartz holder prior to mounting to an integrated circuit wafer.

Figure 3A:
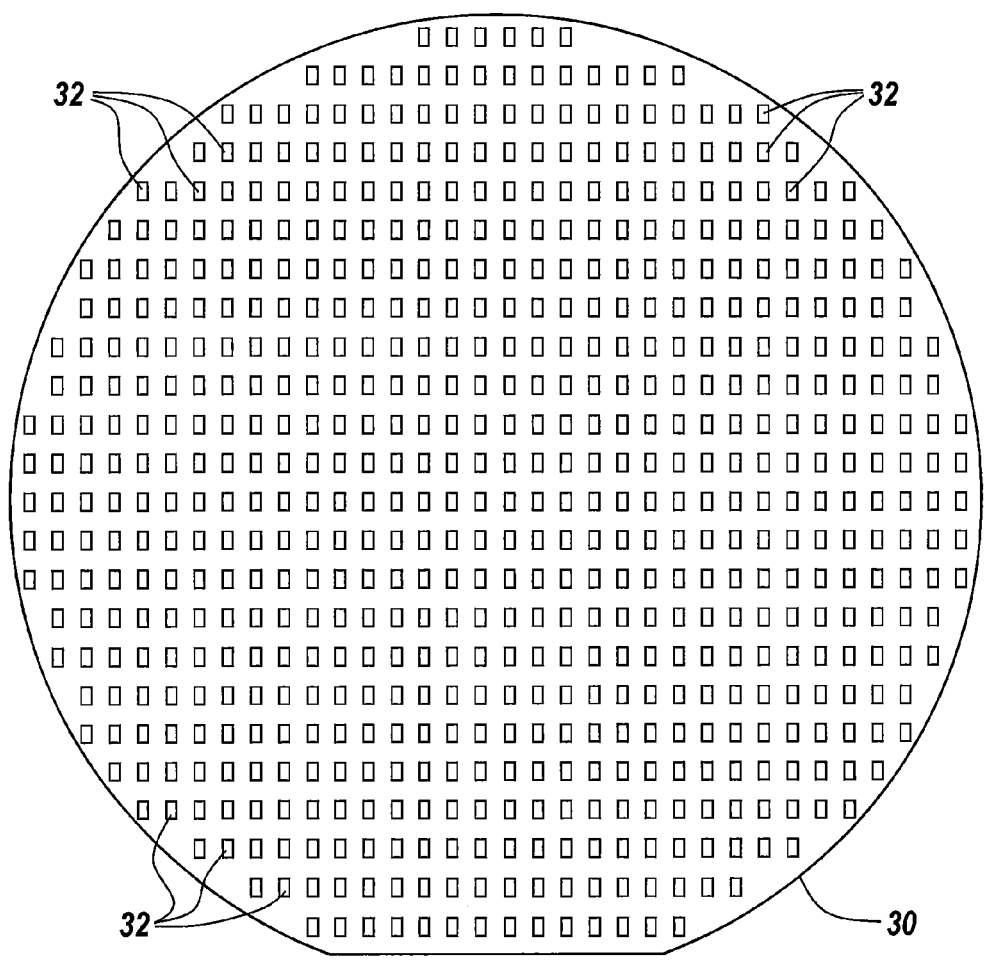
FIG. 3A is a plan view of a wafer-scale quartz blank holder, according to an embodiment of the present invention.
Figure 3B:
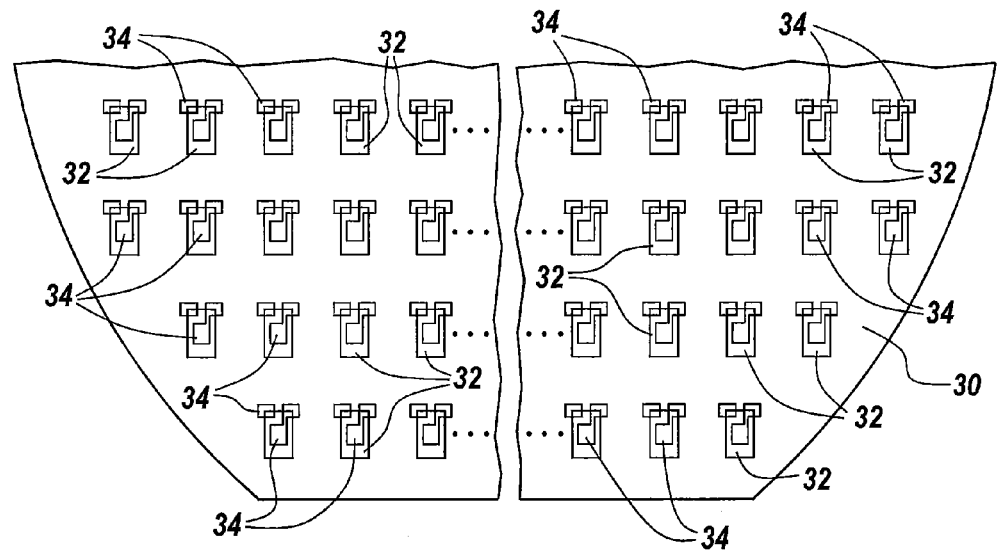
FIG. 3B is a top-down view of a bottom electrode shadow mask mounted underneath the quartz blank holder of FIG. 3A.
Figure 3C:
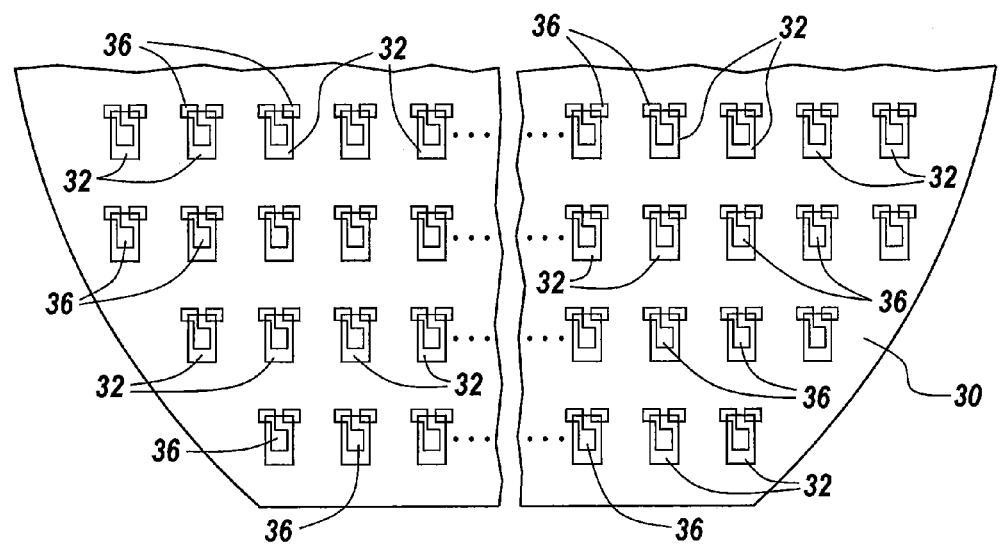
FIG. 3C is a top-down view of a top electrode shadow mask mounted to the quartz blank holder of FIG. 3A.
Figure 3D:
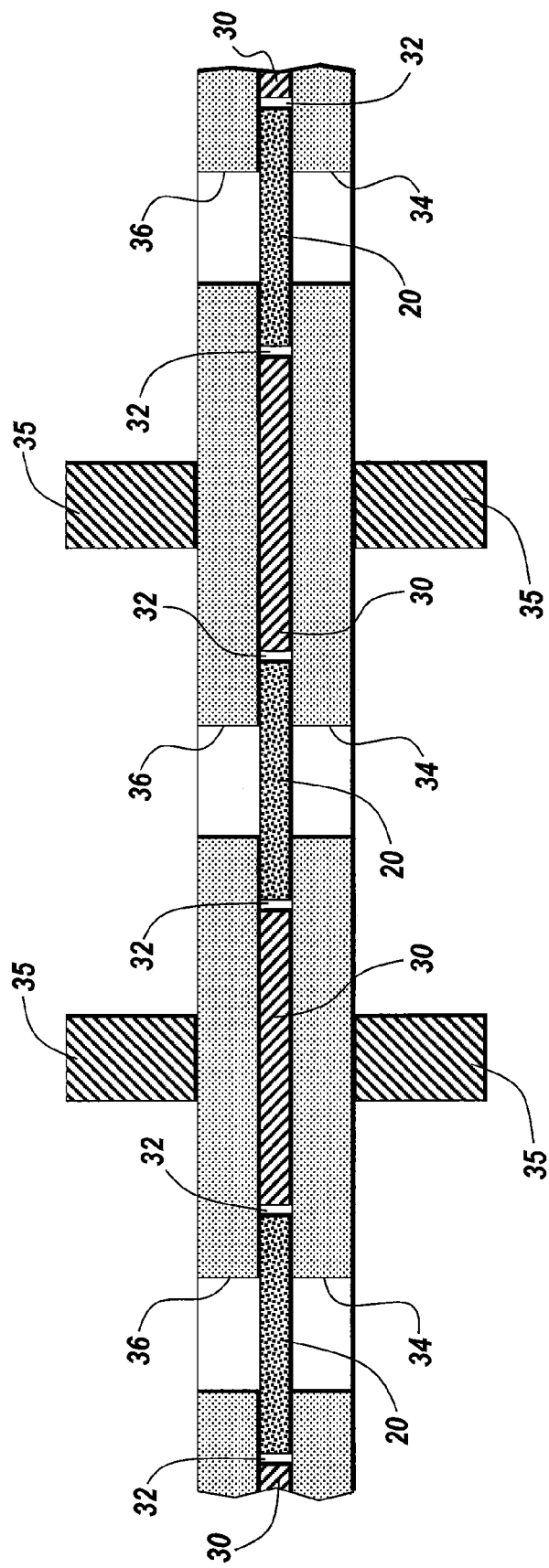
FIG. 3D is a cross-sectional view of a portion of the double-sided shadow mask having a quartz blank holder nested therein.

FIG. 3A illustrates a wafer-scale quartz blank holder 30 having a two-dimensional array of rectangular-shaped openings 32 therein, which have sufficient size to retain quartz crystal blanks therein, as illustrated by FIG. 3D. FIG. 3B is a bottom-up view of a bottom electrode shadow mask mounted to the quartz blank holder of FIG. 3A. This bottom electrode shadow mask includes patterned openings 34 therein that are aligned to each opening 32 within the blank holder 30 and support formation of bottom electrodes on quartz blanks held within the openings 32. In particular, the patterned openings 34 are sufficiently large that they extend outside the dimensions of the openings 32 in the blank holder 30. Accordingly, during bottom electrode deposition, which may be performed at an offset angle relative to normal, the metallization applied to the bottom of the quartz blanks 20 will wrap around the beveled/curved edges of the blanks 20 and support full bottom-to-top wrap-around of the electrically conductive contact cement. FIG. 3C is a top-down view of a top electrode shadow mask mounted to the quartz blank holder of FIG. 3A. This top electrode shadow mask includes patterned openings 36 therein that are aligned to each opening 32 within the blank holder 30 and support formation of top electrodes (and top/bottom electrode contacts) on quartz blanks held within the openings 32. In particular, the patterned openings 36 are sufficiently large that they extend outside the dimensions of the openings 32 in the blank holder 30. Accordingly, during top electrode deposition, which may be performed at an offset angle relative to normal, the metallization applied to the top of the quartz blanks 20 will wrap around the beveled/curved edges of the blanks 20. FIG. 3D illustrates a cross-sectional view of a portion of the double-sided shadow mask of FIGS. 3A-3C having a quartz blank holder 30 nested therein. According to some embodiments of the invention, the quartz blank holder 30 may be permanently mounted to one of the top and bottom shadow masks, but the top and bottom shadow masks may be held in a fixed position relation relative to each other using an array of magnets 35, which operate to hold at least one shadow masks against the quartz blank holder 30 when populated with quartz blanks 20.

Figure 4A:
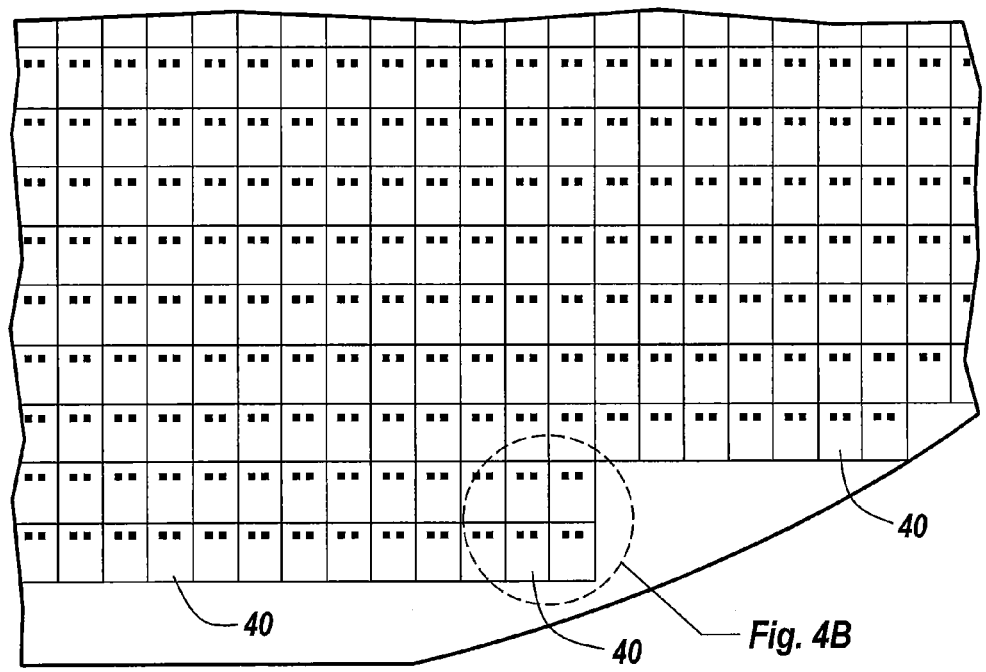
FIG. 4A is a plan view of a portion of an integrated circuit wafer having a two-dimensional array of oscillator circuits therein, which include respective pairs of electrode adhesion bumps on a surface thereof.
Figure 4B:
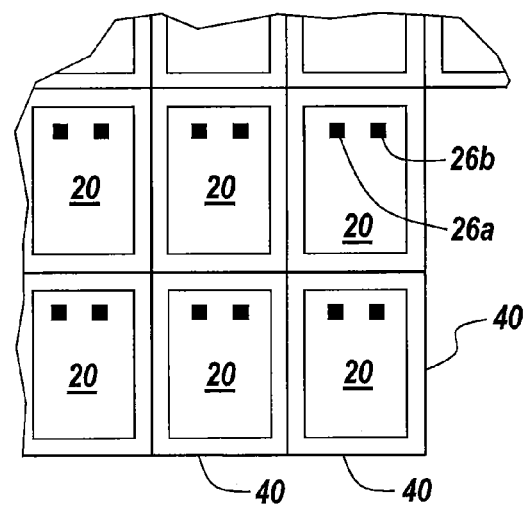
FIG. 4B is an enlarged view of a portion of the integrated circuit wafer of FIG. 4A, after crystal resonator blanks have been mounted thereon.

Referring now to FIGS. 4A-4B, an integrated circuit wafer having a two-dimensional array of oscillator circuits 40 therein is illustrated as including respective pairs of electrode adhesion bumps 26*a*, 26*b* (e.g., electrically conductive cement) on a surface thereof. These adhesion bumps 26*a*, 26*b* may be formed as described hereinabove with respect to Block 114 in FIG. 1A. FIG. 4B is an enlarged view of a portion of the integrated circuit wafer of FIG. 4A, after crystal resonator blanks 20 have been mounted thereon as disclosed above with respect to Blocks 116-120 in FIG. 1A. In particular, as shown by FIGS. 4C-4D, the electrode adhesion bumps 26*a*, 26*b* may be configured to provide electrical contact to the top and bottom electrodes (22, 24*a*-24*b*) associated with each resonator blank 20 and support each resonator blank 20 at a fixed distance above a surface of an underlying oscillator circuit 40 (e.g., above a surface of a passivation layer overlying an oscillator circuit embedded within a silicon substrate).

Figure 4C:
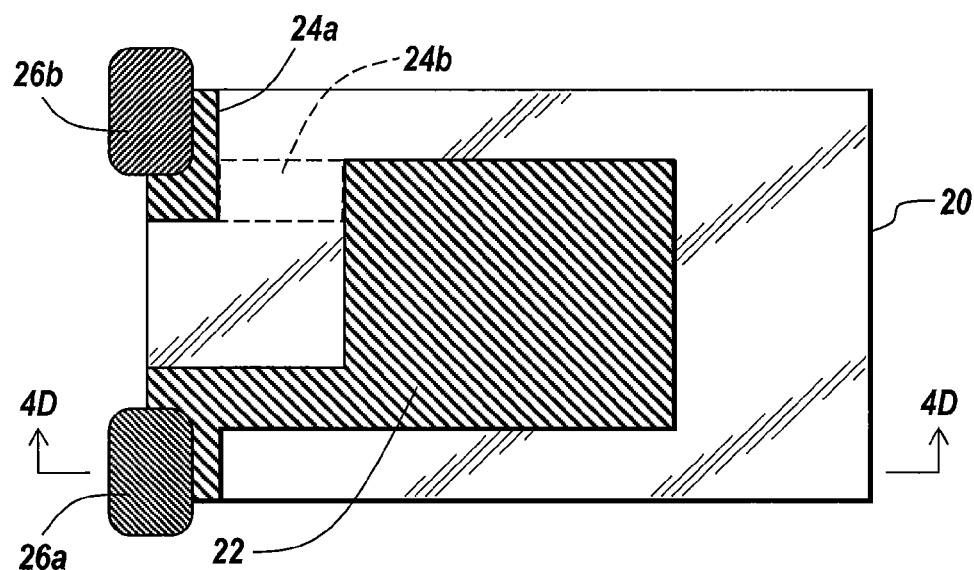
FIG. 4C is a plan view of crystal resonator blank of FIG. 4B.
Figure 4D:
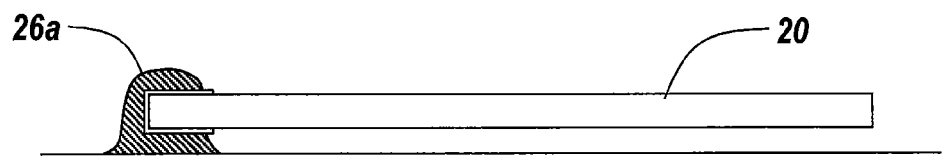
FIG. 4D is a cross-sectional view of the crystal resonator blank of FIG. 4C, taken along line 4D-4D'.
Figure 4E:
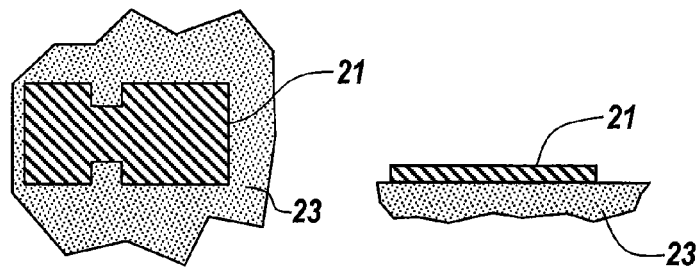
FIGS. 4E-4H are cross-sectional views of a portion of a crystal resonator blank, which illustrate a crystal oscillator fabrication method according to an embodiment of the invention.
Figure 4F:
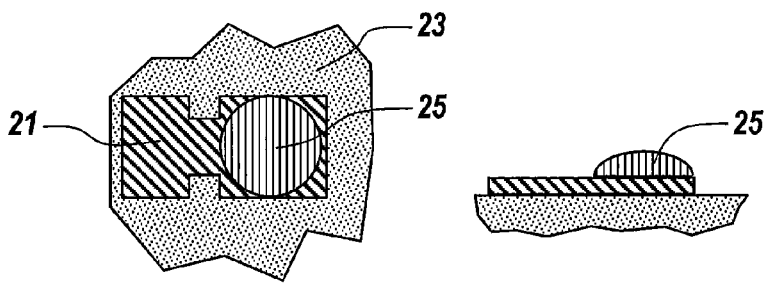
Figure 4G:
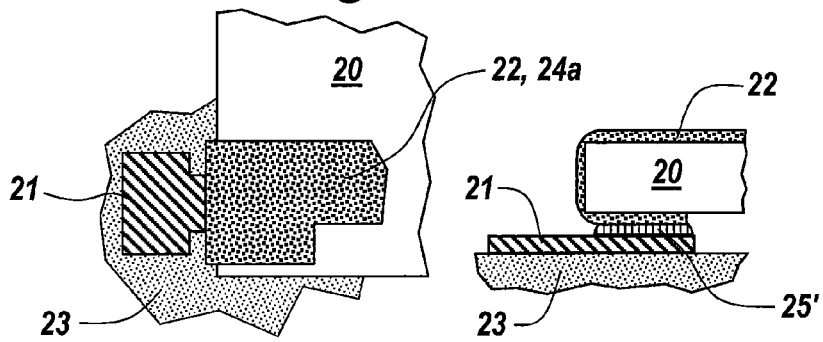
Figure 4H:
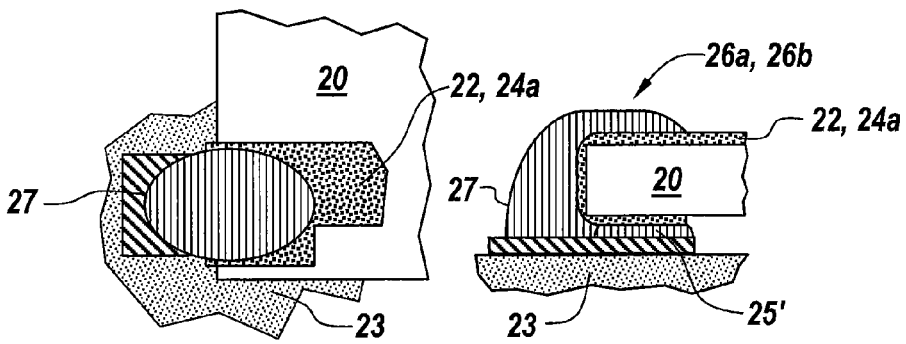

Now, as shown by FIGS. 4E-4H, the electrode adhesion bumps 26*a*, 26*b* of FIGS. 4C-4D may be formed and bonded to a resonator blank 20 having top and bottom electrodes (22, 24*a*-24*b*) thereon. Using the formation methods described herein, resonator blanks 20 having side surfaces that are flat, as opposed to contoured or beveled, may be securely bonded to a substrate with sufficiently high long term reliability to sustain repeated expansion/contraction responsive to temperature changes. In particular, FIG. 4E illustrates a first/second dumbbell-shaped mounting pad 21 (e.g., metal pad) having a constricted neck region intermediate first and second opposing ends thereof, on an underlying substrate 23 (e.g., integrated circuit substrate, package cap/base, etc.). As shown by FIG. 4F, electrically conductive mounting cement may be deposited onto one end of the mounting pad 21 to thereby define a first/second electrode adhesion bump 25 thereon. Thereafter, as shown by FIG. 4G, a top electrode 22 of the crystal oscillator is electrically connected to a first mounting pad 21 by contacting a wraparound extension of the top electrode 22, which is located on a bottom surface of the resonator blank 20, to a first adhesion bump 25'. Similarly, according to FIG. 4G, a bottom electrode 24*b* of the crystal oscillator is electrically connected to a second mounting pad 21 by contacting the bottom electrode 24*b* to a second adhesion bump 25'. The first and second electrode adhesion bumps 25' are then cured using conventional curing techniques.

Following this initial curing, additional electrically conductive mounting cement is deposited onto the top electrode 22, the exposed end of the first mounting pad 21 and an exposed portion of the first electrode adhesion bump 25' to thereby define a top electrode adhesion extension 27. In addition, electrically conductive mounting cement is deposited onto a wraparound extension of the bottom electrode 24a (on the top surface of the crystal blank 20), the exposed end of the second mounting pad 21 and an exposed portion of the second electrode adhesion bump 25' to thereby define a corresponding bottom electrode adhesion extension 27. These electrode adhesion extensions 27 are then cured to complete the fabrication of dual-cured electrode adhesion bumps 26a, 26b, which mechanically secure and electrically short the top electrode 22 to the first mounting pad 21 and the bottom electrode 24a, 24b to the second mounting pad 21.

Figure 5A:
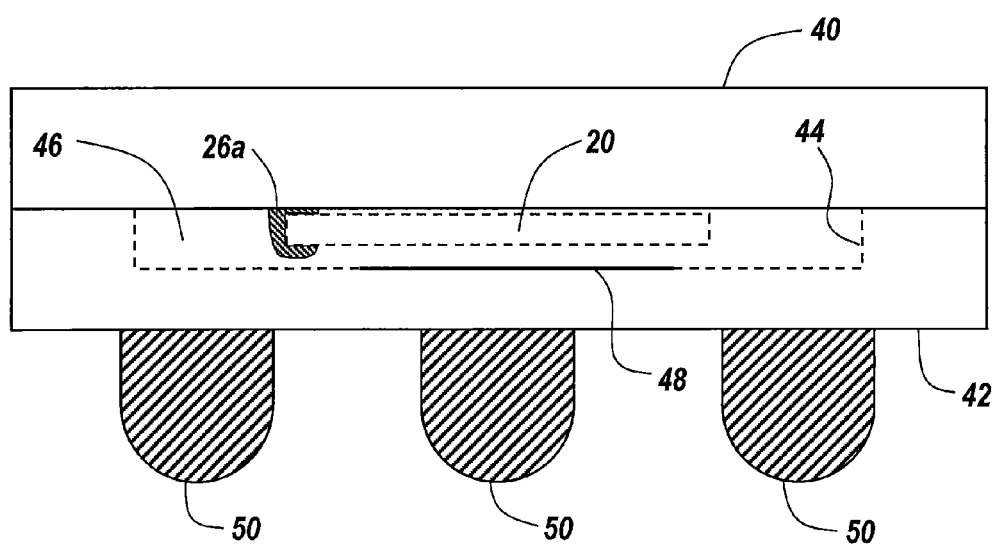
FIG. 5A is a cross-sectional view of packaged crystal-based oscillator circuit, according to embodiments of the invention.
Figure 5B:
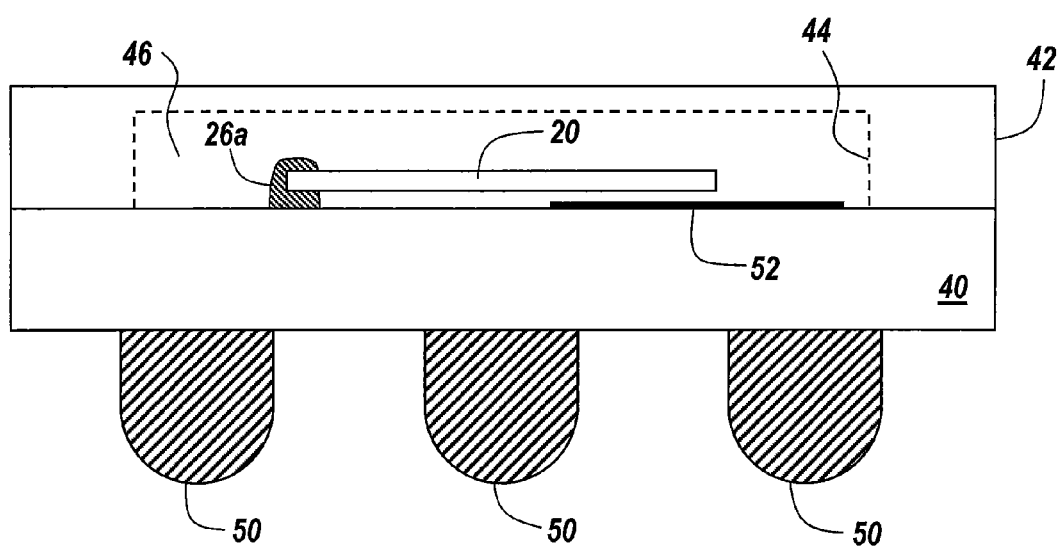
FIG. 5B is a cross-sectional view of packaged crystal-based oscillator circuit with built-in inductor, according to embodiments of the invention.

FIGS. 5A-5B illustrate packaged crystal-based oscillator circuits, which may be finalized as described hereinabove with respect to FIG. 1C and possibly using one or more steps described in U.S. Pat. No. 7,955,885 to Bhugra et al., the disclosure of which is hereby incorporated herein by reference. As illustrated, the packaged oscillator circuit includes an integrated circuit substrate 40 (e.g., silicon die), which has oscillator circuitry therein, and a cap 42 (e.g., silicon cap), which is hermetically bonded to the substrate 40 (e.g., using a eutectic alloy). As described above, each singulated cap 42 includes a recess 44 and cavity 46 therein, which houses a resonator blank 20. This resonator blank 20 is mounted and electrically connected to the underlying substrate 40 by the electrically conductive adhesion bumps 26a, 26b. Electrically conductive through-cap vias (not shown) electrically connect solder bumps 50 to corresponding pads on the substrate 40 in the embodiment of FIG. 5A. In FIG. 5B, the solder bumps 50 are directly connected to the substrate 40.

As further shown by FIG. 5A, the recess 44 within the cap 42 may also include a deposited material layer 48, which can be partially transferred to the resonator blank 20 (as mass loading) during an electrical trimming operation. This electrical trimming operation may be performed before and/or after the singulation of the packaged integrated circuit wafer. According to additional embodiments of the invention, the material layer 48 may be an electrically conductive layer that is formed by removing electrode material from the resonator blank 20 during electrical trimming. In contrast, FIG. 5B illustrates the presence of an inductor 52 on a surface of the substrate 40. As shown, at least a portion of this inductor 52 (e.g., spiral inductor) may be disposed between the resonator blank 20 and the substrate 40. In particular, the inductor 52 may be disposed on an upper passivation layer, which covers the substrate 40. According to some embodiments of the invention, this passivation layer may contain a magnetically reflective layer (e.g., M1 metal layer) that inhibits a reduction in inductor Q caused by the underlying "lossy" substrate.

Figure 6A:
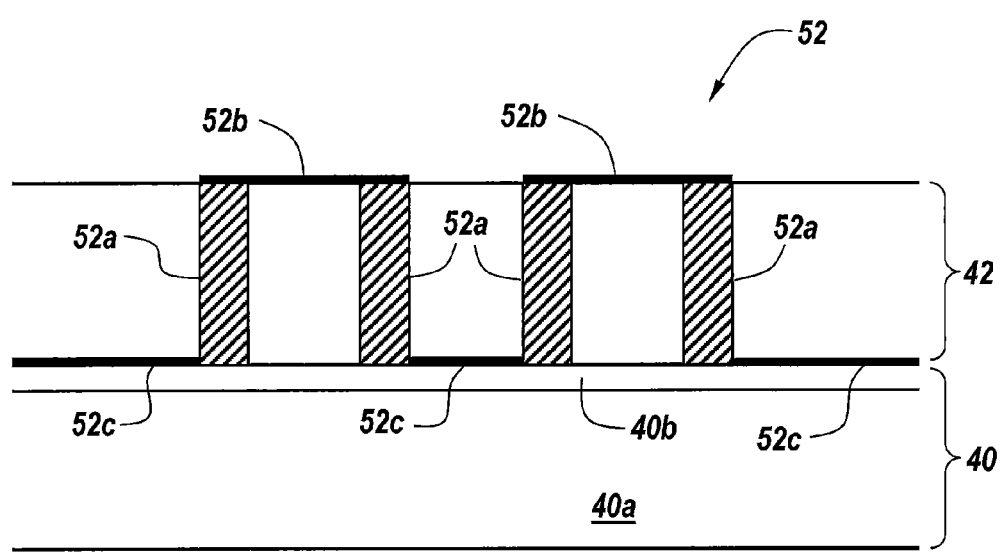
FIG. 6A illustrates a cross-section of an inductor formed in a cap of a packaged oscillator circuit, according to an embodiment of the present invention.

Referring now to FIG. 6A, an inductor 52 may be configured with vertical through-cap vias 52a (TCVs) and planar segments 52b, 52c that are serially connected together, with segments 52b extending on an outside top surface of a cap 42 of a packaged oscillator circuit and segments 52c extending between a bottom surface of the cap 42 and underlying IC passivation layers 40b, which extend on an uppermost surface (e.g., active circuit surface) of an underlying integrated circuit chip 40a within an integrated circuit substrate 40. A centermost bottom segment 52c may be utilized as a center-tap (CT) of the inductor 52 in some embodiments of the invention.

Figure 6B:
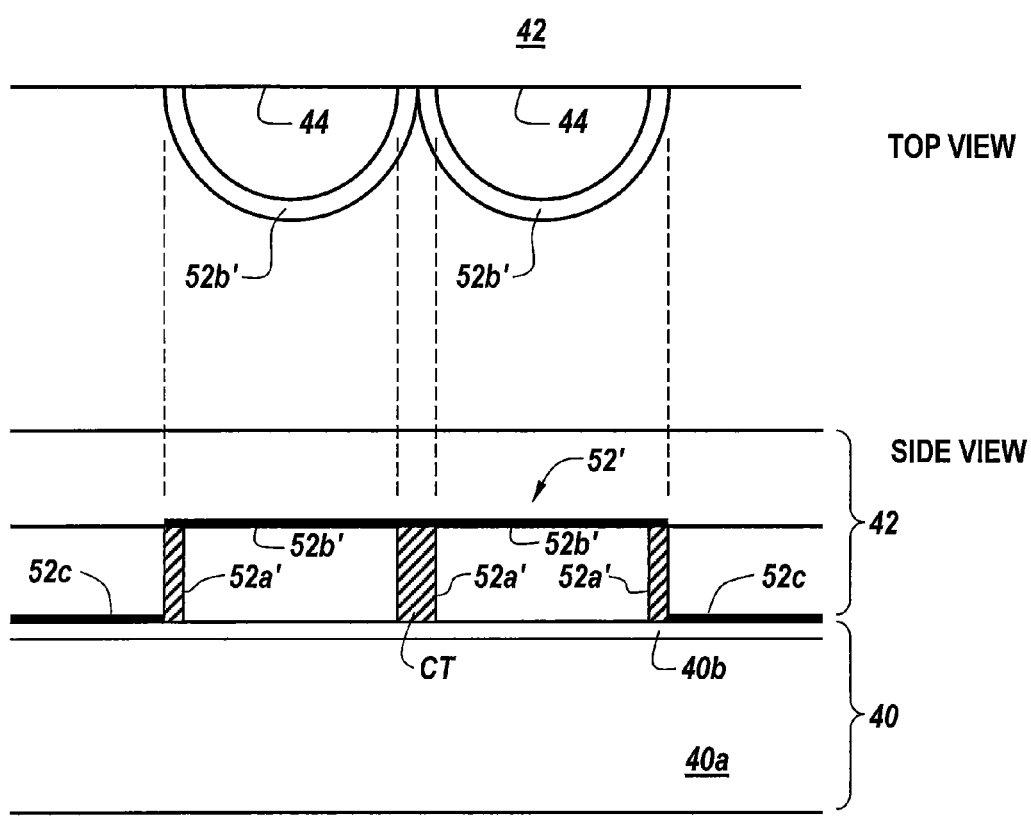
FIG. 6B illustrates a cross-section of an inductor patterned along a sidewall and top surface of a cavity within a packaged oscillator circuit, according to an embodiment of the present invention.

In contrast, the inductor 52' of FIG. 6B replaces the TCVs 52a of FIG. 6A with inductor segments 52a', 52b', which are patterned on a sidewall and top inner surface of a recess 44 within the cap 42, respectively. As shown, the segments 52b' are arcuate-shaped (e.g., circular) inductor segments that are joined at a center tap (CT) of the inductor 52' and the outermost sidewall segments 52a' are electrically connected to lateral segments 52c, which extend between a bottom surface of the cap 42 and the underlying IC passivation layers 40b.

Figure 7:
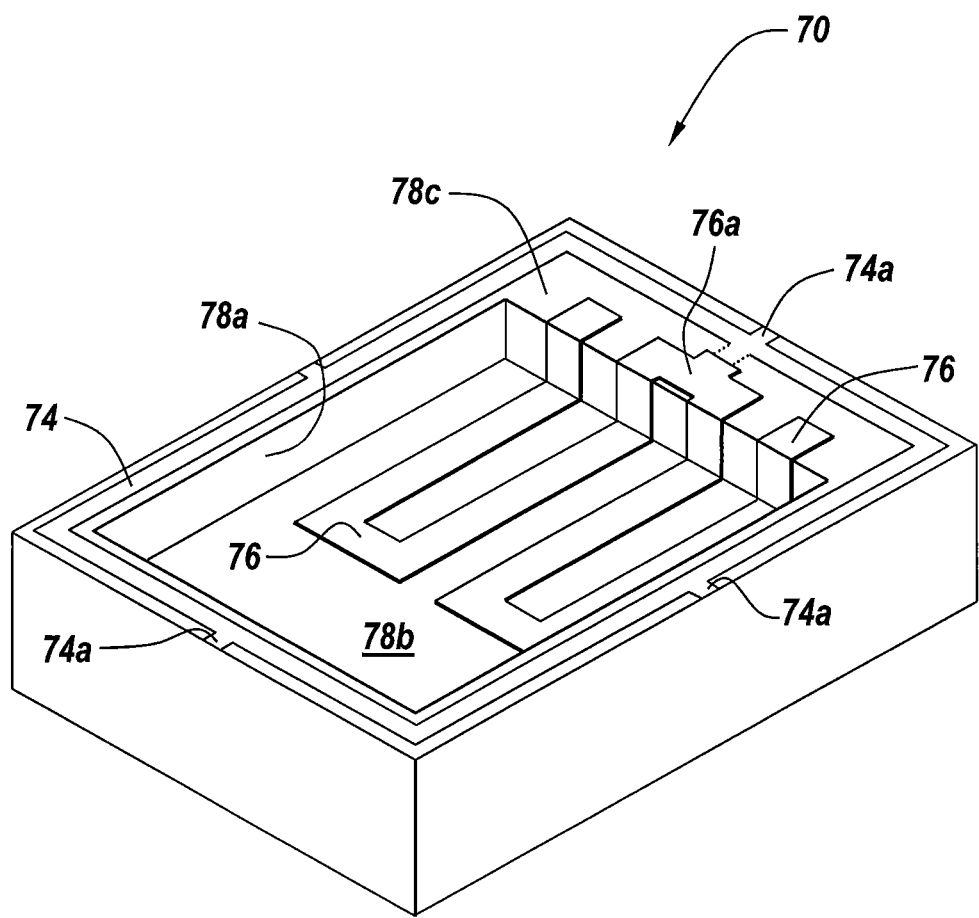
FIG. 7 is a three-dimensional perspective view of an electrically insulating cap having a recess therein containing a patterned inductor, according to an embodiment of the invention.

Referring now to FIG. 7, a three-dimensional perspective view of an electrically insulating cap 70 (e.g., glass cap) is illustrated as including a recess therein having a plurality of sidewalls 78a, an interior top surface 78b within the recess and a primary/bonding surface 78c containing a metal seal ring 74 with tie bar extensions 74a on each side thereof. As shown, a center-tap inductor 76 is patterned to extend on each of the interior top surface 78b, sidewall 78a and bonding surface 78c. In some embodiments of the invention, the inductor 76 may include a pair of arcuate-shaped segments, which may be mirror-images of each other about a center tap. Preferably, these arcuate-shaped segments have rounded corners and may even be semicircular-shaped. In additional embodiments of the invention, a center tap 76a of the inductor 76 may be provided, which is electrically connected to the metal seal ring 74. This metal seal ring 74 may be held at a fixed potential (e.g., GND) during operation of a packaged integrated circuit. According to additional embodiments of the invention, the cap 70 may include a magnetic material therein, which increases an effective inductance of the inductor 76 relative to an otherwise equivalent cap and inductor combination that is devoid of the magnetic material, such as a ferrous-type material or a magnetic rare-earth material.

According to still further embodiments of the invention, methods of forming the electrically insulating cap 70 of FIG. 7 may utilize wafer-scale fabrication techniques, which can include providing a glass plate having a two-dimensional array of recesses (78a, 78b) therein and then plating a relatively thin electrically conductive material (e.g., copper (Cu)) and possibly an adhesion layer using an electroless plating bath, for example. Alternatively, this plating step, if used, may be selective to the non-recess side of the glass plate/wafer. The shape of the center-tap inductor 76 within each of the recesses may be defined by performing deep resolution photoresist and patterning steps on the electrically conductive material. To achieve a desired inductor performance, an electroplating step may be performed to selectively thicken the inductor pattern, using tie bars and seal rings (74, 74a) to provide a necessary electrical connection between all recesses on the plate. In some embodiments of the invention, this electroplating step may utilize a combination of copper (Cu) followed by a low temperature eutectic solder (e.g., AuSn) to enable sealing of the seal rings 74 to a similarly patterned connection material in an underlying integrated circuit wafer, prior to dicing.

Referring now to FIGS. 8A-8B and 9A-9E, a two-piece package 80, which is configured to be electrically coupled (e.g., solder bonded) to an underlying integrated circuit substrate 100, is illustrated as including a hermetically sealed cavity 82 therein and a crystal resonator 84 within the cavity 82. The package is shown as including a cap 86 and a base 88, which has a recess 99 therein. The cap 86 and base 88 are preferably formed of a material selected from a group consisting of glass and ceramics. For example, a photoconvertible glass, such as APEX® glass, manufactured by 3D Glass Solutions, or a photo structurable glass ceramic (PSGC), such as Foturan®, manufactured by Schott Glass Corp and distributed by Invenios®, may be used. In particular, Foturan® is a lithium-potassium glass with small amounts of silver (Ag) and cerium oxide particles distributed therein. When this glass is exposed through a mask to ultraviolet light at a wavelength between 290-330 nm and then heated up to 600° C., a crystallic structure is formed in the illuminated regions. Foturan® may be anisotropically etched to achieve relatively high aspect ratio patterns/holes using an hydrofluoric acid (HF) solution, with the crystallized regions having an etch rate of up to about 20 times higher than the non-crystallized (i.e., vitreous) regions.

Figure 8A:
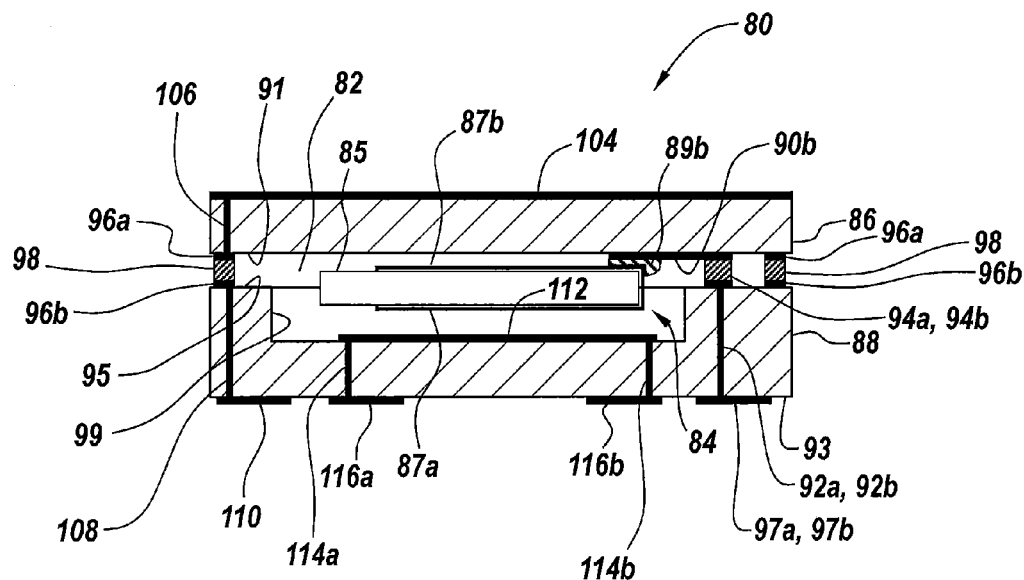
FIG. 8A is a cross-sectional view of a packaged crystal resonator and inductor, according to an embodiment of the invention.
Figure 8B:
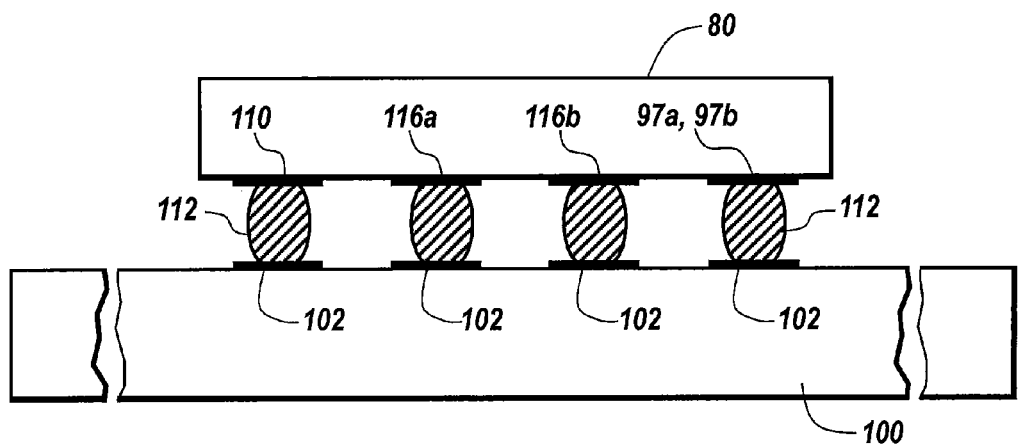
FIG. 8B is a cross-sectional illustration of a packaged crystal resonator and/or inductor, which is solder bonded to an underlying integrated circuit substrate (e.g., semiconductor chip), according to an embodiment of the invention.

The crystal resonator 84 is illustrated as including a crystal blank 85, which may have flat sides, a top electrode 87a primarily on a top surface of the crystal blank 85 and a bottom electrode 87b primarily on a bottom surface of the crystal blank 85. As shown by FIGS. 8A and 9B-9C, each of the top and bottom electrodes 87a-87b may be bonded by a pair of electrically conductive adhesion bumps 89a, 89b to a corresponding pair of electrically conductive traces 90a, 90b, which are formed on a bottom surface 91 of the cap 86 using, for example, metal deposition and patterning techniques. According to some embodiments of the invention, metallization processes may include the use of Ti/W adhesion layers with Cu thereon (as the primary metal). A composite metallization coating of Ni (as a barrier layer) and Au for high solderability and to inhibit oxidation may also be used in some embodiments of the invention.

These top and bottom electrodes 87a, 87b are electrically connected to a pair of contact pads 102 on the underlying integrated circuit substrate 100 by a corresponding pair of electrically conductive traces 90a, 90b and a corresponding pair of electrically conductive vias 92a, 92b (e.g., copper vias with Ti/W adhesion layers), which extend through the base 88 to corresponding contact pads 97a, 97b (e.g., I/O pads) on a bottom surface 93 of the base 88. As illustrated best by FIG. 8A, the pair of electrically conductive vias 92a, 92b in the base 88 are electrically connected to the pair of electrical traces 90a, 90b by a pair of electrically conductive solder connectors 94a, 94b, which extend between the cap 86 and base 88, within the cavity 82.

As illustrated best by FIGS. 8A, 9B-9C and 9E, a perimeter of the cavity 82 is defined by a pair of opposing top and bottom electrically conductive seal rings 96a, 96b on a bottom surface 91 of the cap 86 and an upper surface 95 of the base 88, respectively. According to some embodiments of the invention, the top and bottom electrically conductive seal rings 96a, 96b are sealed together by a frame-shaped solder seal ring 98, which is shown as having a rectangular shape around a perimeter of the cavity 82. As will be understood by those skilled in the art, the solder connectors 94a, 94b and solder seal ring 98 may be formed using a Au/Sn composite.

Referring now to FIGS. 8A, 9A and 9C-9E, an electrically conductive ground shield 104 (e.g., metal shield) is provided to cover at least a majority of a top surface of the cap 86, and an electrically conductive ground shield via 106 is provided, which extends through the cap 86 and electrically connects the ground shield 104 to the frame-shaped solder seal ring 98 and the top and bottom seal rings 96a, 96b. Typically, the base 88 may also include an electrically conductive ground via 108 therein, which electrically connects the frame-shaped solder seal ring 98 to a ground contact pad 110 on a bottom surface 93 of the base 88 and an electrical trace 102 (e.g., contact pad) on the underlying integrated circuit substrate 100, via a solder bond 112 extending therebetween. As shown by FIG. 9D, a plurality of contact pads (e.g., 5 contact pads) on a bottom surface 93 of the base 88 may be used to facilitate electrical contact to the underlying integrated circuit substrate 100.

As further shown by FIGS. 8A and 9D-9E, an inductor 112 may be provided within the recess 99 in the base 88 of the package 80 and first and second terminals 112a, 112b of the inductor 112 may be electrically connected by through-base vias 114a, 114b to corresponding inductor contact pads 116a, 116b on a bottom surface 93 of the base 88. Although the inductor 112 of FIG. 9E is illustrated as being horseshoe-shaped, inductors having many other shapes and configurations may also be provided. For example, according to other embodiments of the invention, the inductor may be a three-terminal center-tapped serpentine-shaped inductor or a two-terminal spiral-shaped inductor.

Figure 10:
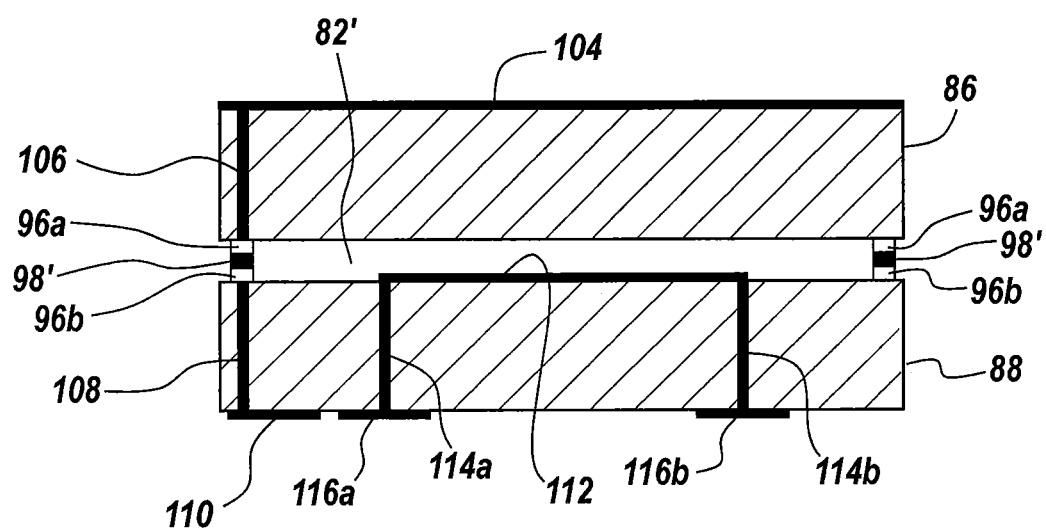
FIG. 10 is a cross-sectional illustration of a packaged inductor with top-surface ground shield, which uses a polymer seal, according to an embodiment of the invention.
Figure 11A:
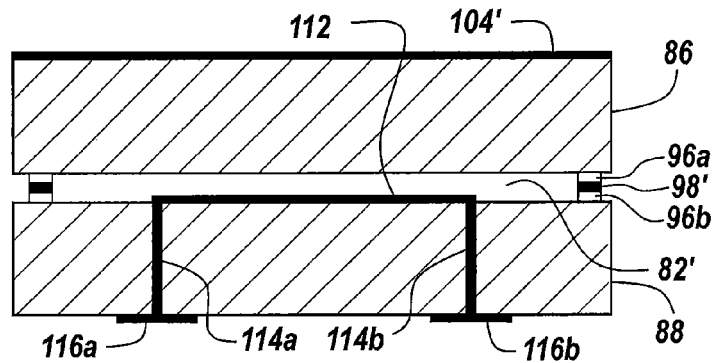
FIG. 11A is a cross-sectional illustration of a packaged inductor with electrically floating top-surface shield, which uses a polymer seal, according to an embodiment of the invention.

Referring now to FIG. 10, a packaged inductor 112 with top-surface ground shield 104 (optional) is illustrated as including a polymer frame-shaped seal 98', which bonds top and bottom seal rings 96a, 96b together to thereby define a reduced-volume cavity 82' between a cap 86 and a base 88 of the package. Typical electrically conductive polymer materials include, but are not limited to, cyanate ester polymers, such as Ablebond JM7000™. As highlighted by the common reference numerals from FIGS. 8A-8B and 9A-9E, this embodiment of the packaged inductor 112 of FIG. 10 is similar to the packaged device of FIG. 8A with the crystal resonator 84 removed, recess 99 omitted and solder seal 98 replaced by the polymer seal 98'. Moreover, according to further embodiments of the invention, the crystal resonator 84 of FIG. 8A may be replaced by a second inductor, which is plated on a bottom surface of the cap 86, to thereby yield a dual-inductor package. With sufficient mutual inductance therebetween, the pair of inductors within a dual-inductor package may be utilized as a packaged micro-transformer. The packaged inductor 112 of FIG. 11A is similar to the packaged inductor 112 of FIG. 10, with the top-surface ground shield 104 replaced by a top-surface electrically floating shield 104'. The packaged inductor 112 of FIG. 11B is similar to the packaged inductor 112 of FIG. 10, with the top-surface ground shield 104 replaced by a cavity ground shield 104" within the cavity 82'.

Figure 11B:
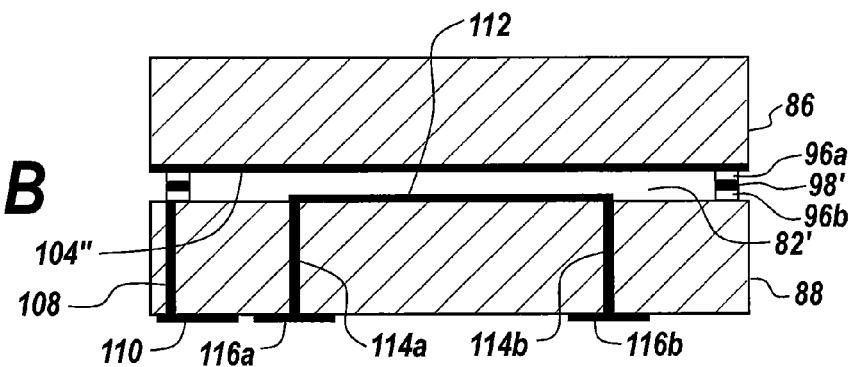
FIG. 11B is a cross-sectional illustration of a packaged inductor with cavity ground shield, which uses a polymer seal, according to an embodiment of the invention.
Figure 11C:
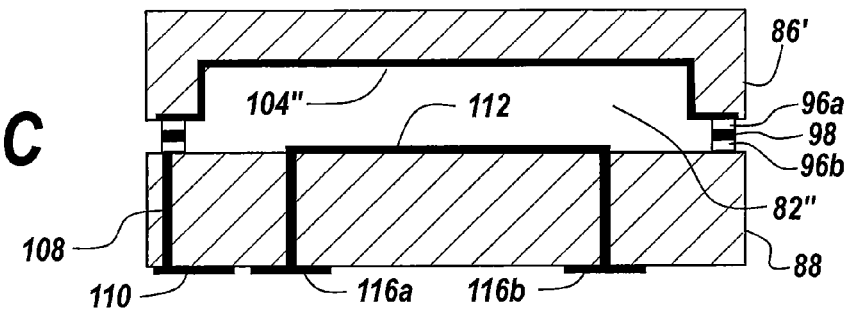
FIG. 11C is a cross-sectional illustration of a hermetically-sealed packaged inductor with cavity ground shield within a cap recess, according to an embodiment of the invention.
Figure 11D:
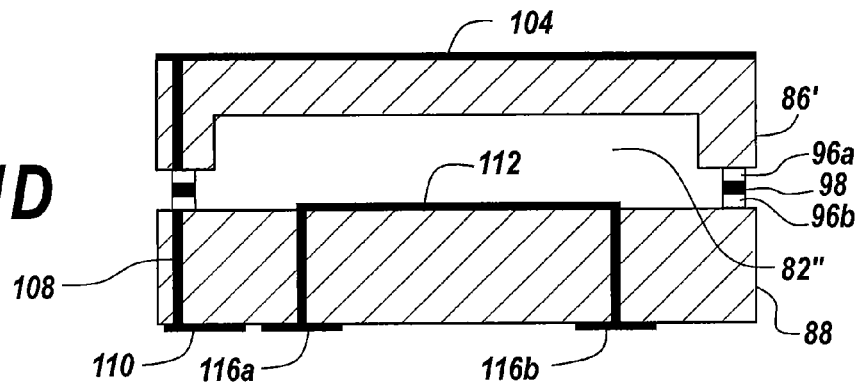
FIG. 11D is a cross-sectional illustration of a hermetically-sealed packaged inductor with planar top-surface ground shield, according to an embodiment of the invention.

According to additional embodiments of the invention, the cavity ground shield 104" of FIG. 11B may be formed in a recess in the cap 86' and the polymer seal 98' may be replaced with a solder seal 98 to thereby define a hermetically-sealed cavity 82", as illustrated by FIG. 11C. Finally, the polymer seal 98' and reduced-volume cavity 82' of FIG. 10 may be replaced by a hermetically-sealed larger volume cavity 82", as shown by FIG. 11D.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:
1. A crystal oscillator fabrication method, comprising:
depositing electrically conductive mounting cement onto first and second electrically conductive mounting pads on a substrate to thereby define first and second electrode adhesion bumps thereon;
electrically connecting first and second electrodes of a crystal oscillator to the first and second mounting pads, respectively, by contacting the first and second electrodes to the first and second electrode adhesion bumps, respectively; then curing the first and second electrode adhesion bumps; then depositing electrically conductive mounting cement onto the first electrode and onto a portion of the first electrode adhesion bump to thereby define a top electrode adhesion extension; and then curing the top electrode adhesion extension.

2. The method of claim 1, wherein the crystal oscillator comprises a crystal blank; wherein the first electrode extends primarily on a top surface of the crystal blank and partially on a bottom surface of the crystal blank; and wherein the second electrode extends on a bottom surface of the crystal blank.

3. The method of claim 1, wherein the crystal oscillator comprises a crystal blank; wherein the first electrode extends primarily on a top surface of the crystal blank and partially on a bottom surface of the crystal blank; and wherein the second electrode extends primarily on a bottom surface of the crystal blank and partially on the top surface of the crystal blank.

4. The method of claim 3, wherein said depositing electrically conductive mounting cement comprises depositing electrically conductive mounting cement onto the second electrode and onto a portion the second electrode adhesion bump to thereby define a bottom electrode adhesion extension on the top surface of the crystal blank; and wherein said curing the top electrode adhesion extension comprises curing the bottom electrode adhesion extension.

5. The method of claim 4, wherein all sides of the crystal blank have flat surfaces that meet the top and bottom surfaces of the crystal blank at right angles.

6. The method of claim 4, wherein the top electrode adhesion extension and the first electrode adhesion bump operate collectively to mechanically secure and electrically short the top electrode to the first mounting pad; and wherein the bottom electrode adhesion extension on the top surface of the crystal blank and the second electrode adhesion bump operate collectively to mechanically secure and electrically short the bottom electrode to the second mounting pad.

7. The method of claim 3, wherein a plurality of sides of the crystal blank have flat surfaces.

8. The method of claim 1, wherein the top electrode adhesion extension and the first electrode adhesion bump operate collectively to mechanically secure and electrically short the top electrode to the first mounting pad.

9. The method of claim 1, wherein said depositing electrically conductive mounting cement onto the first electrode and onto a portion the first electrode adhesion bump comprises depositing the electrically conductive mounting cement directly onto the first mounting pad.

10. The method of claim 1, wherein the first mounting pad is a dumbbell-shaped mounting pad with a constricted neck region intermediate first and second opposing ends thereof; and wherein the first electrode adhesion bump extends directly on the first end of the dumbbell-shaped mounting pad and the top electrode adhesion extension extends directly on the second end of the dumbbell-shaped mounting pad.

11. The method of claim 1, wherein the first electrode adhesion bump extends directly on a first portion of first mounting pad and the top electrode adhesion extension extends directly on a second portion of the first mounting pad.

12. A crystal oscillator fabrication method, comprising:

depositing electrically conductive mounting cement onto a first portion of an electrically conductive mounting pad to thereby define an electrode adhesion bump thereon;

electrically connecting an electrode of a crystal oscillator to the mounting pad by contacting the electrode to the electrode adhesion bump; then at least partially curing the electrode adhesion bump to mechanically secure the electrode to the mounting pad; then depositing electrically conductive mounting cement onto the electrode, at least a portion of the at least partially cured electrode adhesion bump and a second portion of the mounting pad to thereby define an electrode adhesion extension; and then curing the electrode adhesion extension to further mechanically secure and electrically short the electrode adhesion extension to the mounting pad.

13. The method of claim 12, wherein the crystal oscillator comprises a crystal blank having a plurality of sides with flat surfaces; wherein the electrode contacts top and bottom surfaces of the crystal blank; wherein said electrically connecting comprises electrically connecting a first portion of the electrode that contacts the bottom surface of the crystal blank to the mounting pad by contacting the first portion of the electrode to the electrode adhesion bump; and wherein said depositing electrically conductive mounting cement onto the electrode comprises depositing electrically conductive mounting cement directly onto a second portion of the electrode that contacts the top surface of the crystal blank.

14. The method of claim 12, wherein the mounting pad is a dumbbell-shaped mounting pad with a constricted neck region intermediate first and second ends thereof, which correspond to the first and second portions of the mounting pad, respectively.

* * * * *